(12) United States Patent
Jeon et al.

(10) Patent No.: US 11,538,950 B2
(45) Date of Patent: Dec. 27, 2022

(54) SOLAR CELL PANEL

(71) Applicant: LG ELECTRONICS INC., Seoul (KR)

(72) Inventors: Joonho Jeon, Seoul (KR); Jungguen Kim, Seoul (KR); Song Yong, Seoul (KR); Junghwan Yeom, Seoul (KR); Jeonghun Woo, Seoul (KR); Eonjoo Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 92 days.

(21) Appl. No.: 15/858,901

(22) Filed: Dec. 29, 2017

(65) Prior Publication Data
US 2018/0198011 A1   Jul. 12, 2018

(30) Foreign Application Priority Data

Jan. 6, 2017   (KR) .................. 10-2017-0002484

(51) Int. Cl.
| | | |
|---|---|---|
| *H01L 31/0465* | (2014.01) | |
| *H01L 31/049* | (2014.01) | |
| *H01L 31/048* | (2014.01) | |
| *H01L 31/02* | (2006.01) | |

(52) U.S. Cl.
CPC .......... *H01L 31/0465* (2014.12); *H01L 31/02* (2013.01); *H01L 31/048* (2013.01); *H01L 31/049* (2014.12); *Y02E 10/50* (2013.01)

(58) Field of Classification Search
CPC .............. H01L 31/0465; H01L 31/049; H01L 31/0203; H01L 31/0216; H01L 31/0224; H01L 31/022433; H01L 31/022441; H01L 31/048; H01L 31/05; H01L 31/0508; H01L 31/0516
See application file for complete search history.

(56) References Cited

U.S. PATENT DOCUMENTS

| | | | |
|---|---|---|---|
| 2009/0090412 A1 | 4/2009 | Calwer et al. | |
| 2009/0255569 A1* | 10/2009 | Sampsell | ........ H01L 31/022425 136/246 |
| 2014/0116495 A1* | 5/2014 | Kim | ........ H02S 40/22 136/246 |

(Continued)

FOREIGN PATENT DOCUMENTS

| | | |
|---|---|---|
| CH | 678466 A5 | 9/1991 |
| JP | 2012-33546 A | 2/2012 |

(Continued)

*Primary Examiner* — Mayla Gonzalez Ramos
(74) *Attorney, Agent, or Firm* — Birch, Stewart, Kolasch & Birch, LLP (57) ABSTRACT

A solar cell panel using a back contact solar cell is disclosed. The solar cell panel includes a front substrate, a back sheet positioned opposite the front substrate, a plurality of solar cells positioned between the front substrate and the back sheet and connected to one another by a plurality of conductive lines electrically connecting two adjacent solar cells, an encapsulant covering the plurality of solar cells, and at least one blocking portion blocking the plurality of conductive lines that is otherwise visible between the solar cells from being visually seen. The at least one blocking portion is positioned between a back surface of the front substrate and the encapsulant.

12 Claims, 10 Drawing Sheets

(56) References Cited

U.S. PATENT DOCUMENTS

| | | | |
|---|---|---|---|
| 2014/0352764 A1* | 12/2014 | Kim | H01L 31/049 136/251 |
| 2015/0059831 A1* | 3/2015 | Fukumochi | H01L 31/048 136/246 |
| 2015/0207003 A1* | 7/2015 | Woo | H01L 31/056 136/246 |
| 2015/0381109 A1 | 12/2015 | Choi et al. | |
| 2016/0149065 A1* | 5/2016 | Pass | H01L 31/0512 136/244 |
| 2016/0190055 A1* | 6/2016 | Jinbo | H01L 27/3276 257/99 |
| 2016/0268466 A1* | 9/2016 | Ogawa | H01L 31/0504 |

FOREIGN PATENT DOCUMENTS

| | | |
|---|---|---|
| JP | 2014-143384 A | 8/2014 |
| JP | 2016-25235 A | 2/2016 |
| KR | 10-2011-0000695 A | 1/2011 |
| KR | 10-2014-0040348 A | 4/2014 |
| KR | 10-2014-0098304 A | 8/2014 |
| KR | 10-2014-0109542 A | 9/2014 |
| KR | 10-2015-0014251 A | 2/2015 |
| KR | 10-2015-0083748 A | 7/2015 |
| KR | 10-2015-0086617 A | 7/2015 |
| KR | 10-2015-0145148 A | 12/2015 |

* cited by examiner

SOLAR CELL PANEL

CROSS-REFERENCE TO RELATED APPLICATION

This application claims the priority benefit of Korean Patent Application No. 10-2017-0002484 filed in the Korean Intellectual Property Office on Jan. 6, 2017, the entire contents of which are incorporated herein by reference in its entirety.

BACKGROUND OF THE INVENTION

Field of the Invention

Embodiments of the invention relate to a solar cell panel using back contact solar cells.

Description of the Related Art

Recently, as existing energy sources such as petroleum and coal are expected to be depleted, interests in alternative energy sources for replacing the existing energy sources are increasing. Among the alternative energy sources, solar cells are attracting attention as next generation cell converting solar energy into electric energy.

Because a single solar cell generates a small amount of electricity, several solar cells are connected to form a solar cell panel. The solar cell panel is used for solar power generation.

A method of manufacturing the solar cell panel includes a process for forming and connecting a plurality of strings each including a plurality of solar cells that are connected to one another and a process for laminating the plurality of solar cells arranged in an m×n matrix, a front substrate, and a back sheet encapsulant. The whole process for manufacturing the solar cell panel is referred to as modularization.

SUMMARY OF THE INVENTION

Accordingly, an object of the present disclosure is to address the above-described and other problems, and embodiments of the invention provide a solar cell panel capable of easily modularizing back contact solar cells.

In one aspect, there is provided a solar cell panel including a front substrate, a back sheet positioned opposite the front substrate, a plurality of solar cells positioned between the front substrate and the back sheet and connected to one another by a plurality of conductive lines electrically connecting two adjacent solar cells, an encapsulant covering the plurality of solar cells, and at least one blocking portion blocking the plurality of conductive lines that is otherwise visible between the solar cells from being visually seen, the at least one blocking portion being positioned between a back surface of the front substrate and the encapsulant.

It is preferable, but not required, that the at least one blocking portion is made of an opaque ceramic resin and has substantially the same color as the back sheet.

It is preferable, but not required, that a distance between the at least one blocking portion and the back sheet is less than a distance between the front substrate and the back sheet.

It is preferable, but not required, that the at least one blocking portion has a line shape extending in a first direction so that the at least one blocking portion can entirely cover between the plurality of solar cells positioned on the same line in a second direction intersecting the first direction. The blocking portion may include a first portion having a predetermined width over the first direction and a second portion having a varying width over the first direction.

It is preferable, but not required, that the width of the first portion is greater than a distance (t) between two solar cells which are adjacent to each other in the first direction.

More preferably, the width of the first portion may be less than a sum (=t+3 mm) of the distance (t) between the two solar cells plus 3 mm.

The second portion may have a rhombus shape.

Each of the plurality of solar cells may be formed using a pseudo-square shaped semiconductor substrate, of which an edge has an inclined chamfer.

A plurality of blocking portion may be positioned between every two solar cells which are adjacent to each other in the first direction.

A distance between the blocking portions which are adjacent to each other in the second direction intersecting the first direction may be less than a distance between two solar cells which are adjacent to each other in the first direction.

Adjacent blocking portions may be spaced apart from each other by a distance corresponding to a width of the solar cell in the first direction.

The front substrate may be a glass substrate having a curvature.

The at least one blocking portion may be formed on the back surface of the front substrate opposite the back sheet.

The solar cell panel may further include an intercell connector positioned between the adjacent solar cells and electrically connecting the plurality of conductive lines connected to each of the adjacent solar cells.

Each of the plurality of solar cells may be a back contact solar cell in which first and second electrodes each collecting carriers of different conductive types are positioned on a back surface of a semiconductor substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein.

Wherever possible, the same reference numbers will be used throughout the drawings to refer to the same or like parts. It will be noted that a detailed description of known arts will be omitted if it is determined that the detailed description of the known arts can obscure the embodiments of the invention. In addition, various embodiments illustrated in the drawings are illustrative and may not be illustrated to actual scale for convenience of explanation. The shape or structure may also be illustrated by simplicity.

Figure 1:
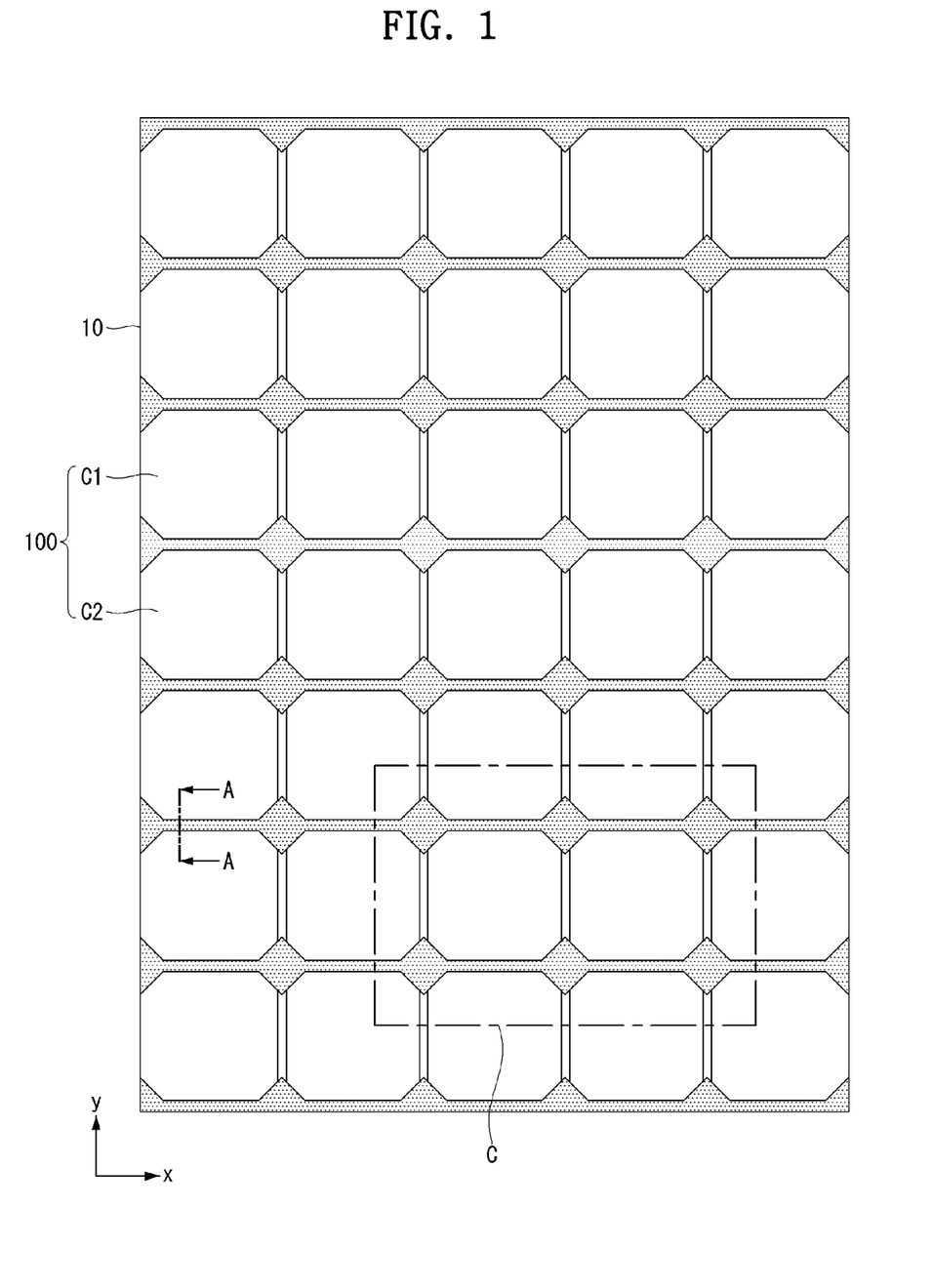
FIG. 1 is a plan view illustrating a whole shape of a solar cell panel according to an embodiment of the invention.
Figure 2:
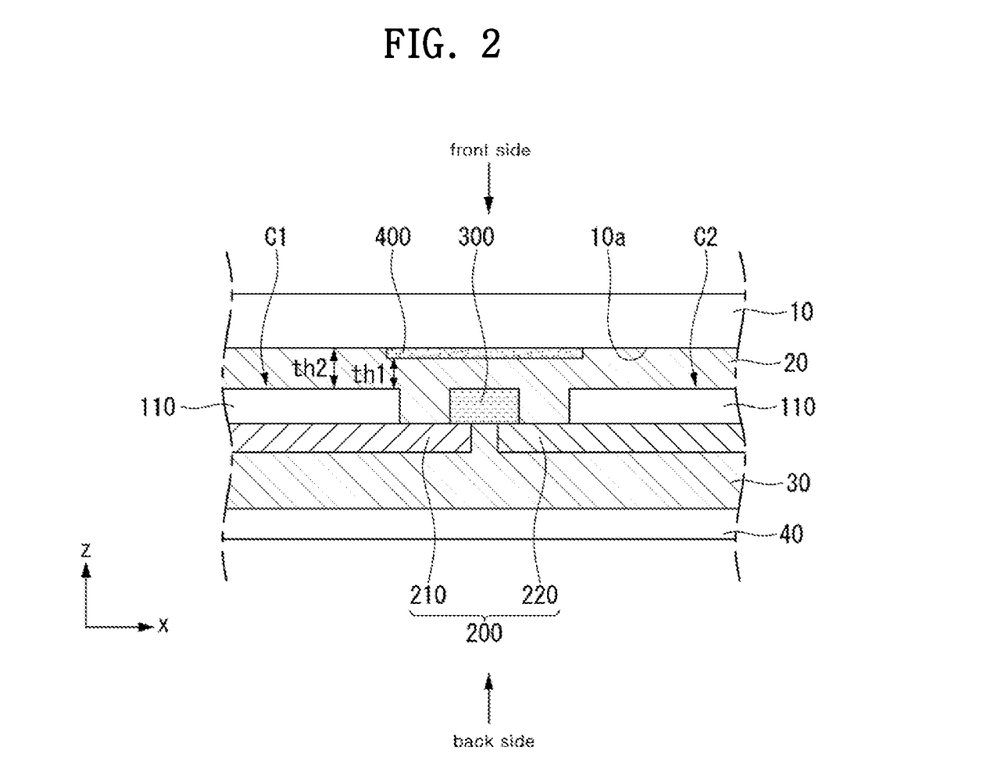
FIG. 2 is a schematic cross-sectional view taken along line A-A' of FIG. 1.

FIG. 1 is a plan view illustrating a whole shape of a solar cell panel according to an embodiment of the invention. FIG. 2 is a schematic cross-sectional view taken along line A-A' of FIG. 1.

Referring to FIGS. 1 and 2, a solar cell panel according to an embodiment of the invention includes a plurality of solar cells 100, conductive lines 200, and intercell connectors 300. The plurality of solar cells 100 is sealed by encapsulants 20 and 30. A front substrate 10 is positioned at a front surface of the solar cell panel, and a back sheet 40 is positioned at a back surface of the solar cell panel. In addition, the solar cell panel according to the embodiment of the invention includes a blocking portion 400 that visually blocks a portion of the intercell connector 300, that is positioned in a spacing between a first solar cell C1 and a second solar cell C2 and is seen at the front, and a portion of the conductive lines 200 connected to the intercell connector 300.

The plurality of solar cells is arranged in an m×n matrix, and the number of solar cells may vary depending on a performance of electricity generation of the solar cell panel. A bunch of the solar cells arranged in a first direction (e.g., a y-axis direction in the drawings) is referred to as a string, and the strings are electrically connected to each other by a bus ribbon (not shown). Embodiments of the invention may use the conductive lines 200 as the bus ribbon, but are not limited thereto. The neighboring strings are arranged in parallel with one another in a second direction (e.g., an x-axis direction in the drawings) intersecting the first direction. The solar cells used in the solar cell panel according to the embodiment of the invention are back contact solar cells, and thus electrodes 140 including first and second electrodes 141 and 142 are positioned on a back surface (e.g., an opposite surface of a surface on which light is incident) of the back contact solar cell. Configuration of the back contact solar cell will be described in detail later.

The conductive lines 200 are connected to only the first electrode 141 or only the second electrode 142 of each solar cell in a direction intersecting a formation direction of the first and second electrodes 141 and 142. Hereinafter, the conductive lines 200 are divided into first conductive lines 210 and second conductive lines 220 in accordance with the first electrode 141 or the second electrode 142 connected to each conductive line.

The plurality of first and second conductive lines 210 and 220 selectively attached only to the first electrode 141 and the second electrode 142 of each solar cell are commonly connected to the intercell connector 300 between the first solar cell C1 and the second solar cell C2 that are adjacent to each other in the first direction y, thereby connecting the two adjacent solar cells C1 and C2 in series.

The intercell connector 300 is positioned between two solar cells, for example, the first solar cell C1 and the second solar cell C2 that are adjacent to each other in the first direction y. Embodiments of the invention may use the conductive line 200 as the intercell connector 300, but are not limited thereto. The first solar cell C1 and the intercell connector 300 are connected to each other by the first conductive lines 210, and the second solar cell C2 and the intercell connector 300 are connected to each other by the second conductive lines 220.

Because the intercell connector 300 is positioned between every the two solar cells as described above, it is easy to repair the solar cell. Namely, when there is a solar cell (hereinafter referred to as "a broken solar cell") that has to be replaced, first and second conductive lines connected to the broken solar cell are disconnected from an intercell connector adjacent to the broken solar cell, and the broken solar cell is removed from a string. A new solar cell is positioned in a place where the broken solar cell is positioned, and then the first and second conductive lines connected to the new solar cell are again connected to the intercell connector. Hence, the broken solar cell can be replaced by the new solar cell.

The blocking portion 400 is formed between a back surface 10a of the front substrate 10 and the encapsulants 20 and 30. The blocking portion 400 prevents the intercell connector 300, which is exposed between the first and second solar cells C1 and C2 when viewed from the front surface of the solar cell panel, and the conductive lines 200 connected to the intercell connector 300 from being seen from the front, thereby improving the design of the solar cell panel. It is preferable, but not required, that a front surface (i.e., an opposite surface of a surface attached to the intercell connector 300) of the blocking portion 400 has substantially the same color as the back sheet 40 that is seen between the strings. Hence, because the blocking portion 400 and the back sheet 40 are not visually distinguished from each other, an appearance of the solar cell panel can be visually improved when the solar cell panel is viewed from the outside. In embodiments disclosed herein, the term "substantially the same" is used to mean not only being 100% completely identical but also including that the colors of the back sheet and the blocking portion are not visually distinguished from each other when viewed at a predetermined distance.

The blocking portion 400 may be formed using well-known methods such as a screen printing method capable of pattern-printing an opaque ceramic resin generally used in the back surface 10a of the front substrate 10 and a coating method. The opaque ceramic resin printed or coated may be thermally cured and processed so that thermal and chemical changes do not occur. Alternatively, the blocking portion 400 may be formed by attaching an opaque film to the back surface 10a of the front substrate 10. Even in this instance, it is preferable, but not required, that the blocking portion 400 is processed so that thermal and chemical changes do not occur, or the blocking portion 400 uses a film formed of a material capable of preventing the thermal and chemical changes from occurring. The blocking portion 400 may include a pigment or a colorant which makes the blocking portion 400 have the same color as the back sheet 40. The pigment or the colorant included in the ceramic resin may use various materials that are generally used without particular limitation.

A lamination process is performed in a state where the encapsulant is laid up between the front substrate and the solar cells. In the lamination process, the encapsulant is present in sheet form and is cured as it is thermally compressed. However, because the blocking portion 400 is formed on the back surface 10a of the front substrate 10, the blocking portion 400 may thermally and chemically react with the encapsulant in the lamination process. Thus, the blocking portion 400 may use a material that does not generate thermal and chemical changes, or may be thermally cured to be prevented from being thermally and chemically deformed during the lamination process.

It is preferable, but not required, that the blocking portion 400 is formed on the back surface 10a of the front substrate 10. Hence, a thickness or distance th1 between the solar cell and the blocking portion 400 is less than a thickness or distance th2 between the solar cell and the front substrate 10.

The lamination process simultaneously applying heat and pressure may be performed in a state where the plurality of solar cells connected by the conductive lines 200 and the intercell connector 300 are disposed between the front substrate 10 and the back sheet 40, and the transparent encapsulants 20 and 30 are respectively disposed on the front surfaces and the back surfaces of the plurality of solar cells. Hence, the components may be integrated and encapsulated.

The front substrate 10 is positioned on the front surfaces (i.e., a light receiving surface on which light is incident) of the solar cells and may be made of a hard material that is not flexible for impact protection. For example, the front substrate 10 may be formed of a tempered glass, etc. having a high transmittance and an excellent damage prevention function.

The back sheet 40 is positioned on the back surfaces (i.e., a non-light receiving surface on which light is not incident) of the solar cells and may be made of a flexible material unlike the front substrate 10. The back sheet 40 can prevent moisture and oxygen from penetrating into the back surfaces of the solar cells and protect the solar cells from an external environment. The back sheet 40 may have a multi-layered structure including a moisture/oxygen penetrating prevention layer, a chemical corrosion prevention layer, etc. The back sheet 40 may be formed as a thin sheet made of an insulating material, for example, fluoropolymer/polyester/fluoropolymer (FP/PE/FP). Insulating sheets made of other insulating materials may be used in the back sheet 40.

The encapsulants 20 and 30 are respectively positioned between the solar cells and the front substrate 10 and between the solar cells and the back sheet 40 and encapsulate the plurality of strings connected by the bus ribbon.

The encapsulants 20 and 30 may be formed of an insulating material with light transmission and adhesion, in order to prevent the penetration of moisture and oxygen. For example, the encapsulants 20 and 30 may be made of an ethylene vinyl acetate (EVA) copolymer resin, a polyvinyl butyral resin, a silicon resin, an ester-based resin, an olefin-based resin, and the like.

The encapsulant is softened and cured by heat and pressure in the lamination process for integrating the plurality of strings, the back sheet, and the front transparent substrate with the encapsulant. Hence, the encapsulant 30 may be formed on the plurality of conductive lines 200 and the back surface of the intercell connector 300, and the encapsulant 20 may be formed on the front surface of the blocking portion 400.

A structure in which adjacent back contact solar cells are connected in series by the conductive lines 200 and the intercell connector 300 is described in detail below with reference to FIGS. 3 and 4.

Figure 3:
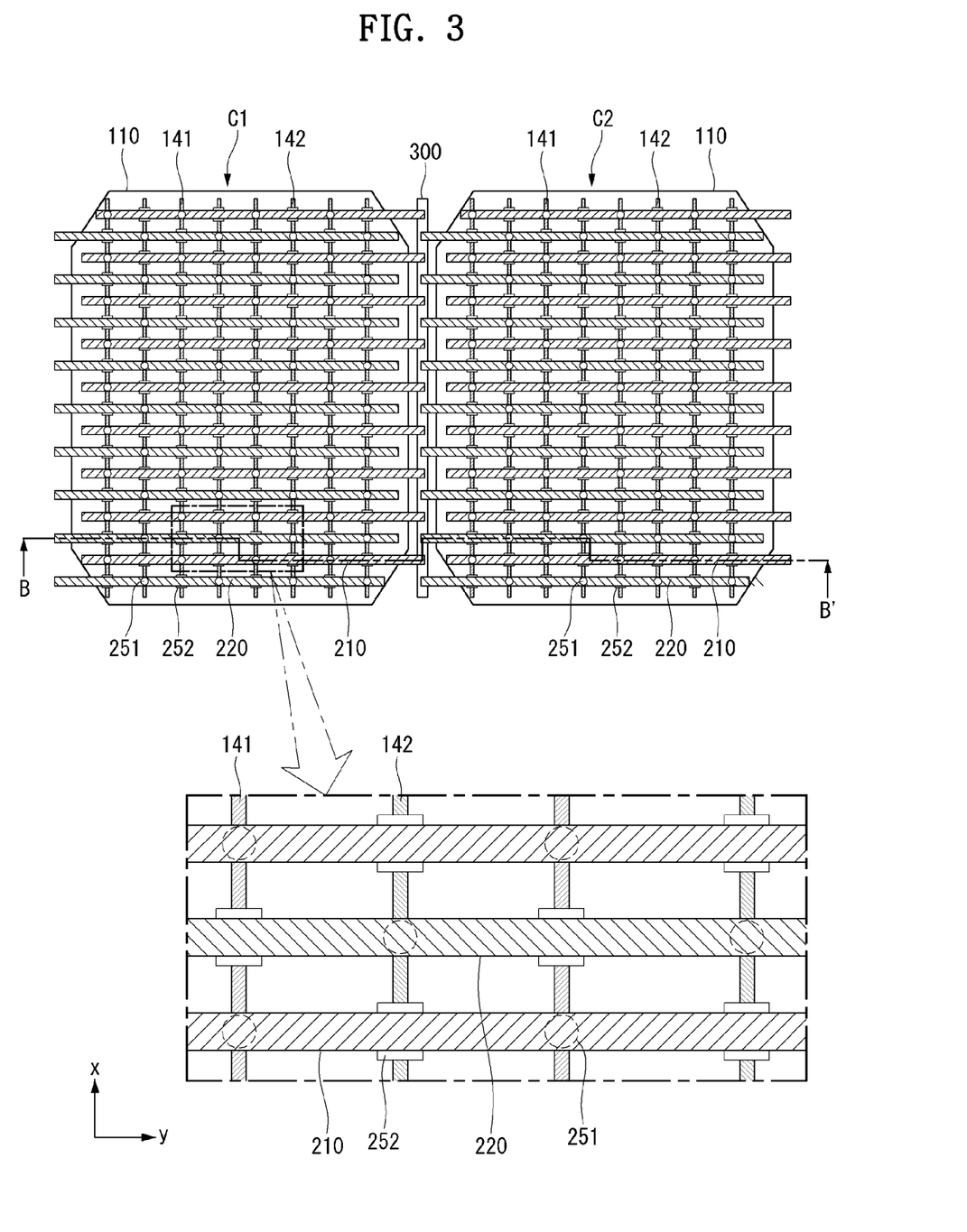
FIG. 3 is a plan view illustrating the connection of two adjacent solar cells in the solar cell panel shown in FIG. 1.

FIG. 3 is a plan view illustrating the connection of two adjacent solar cells in the solar cell panel shown in FIG. 1. FIG. 4 is a cross-sectional view taken along line B-B' of FIG. 3.

Figure 4:
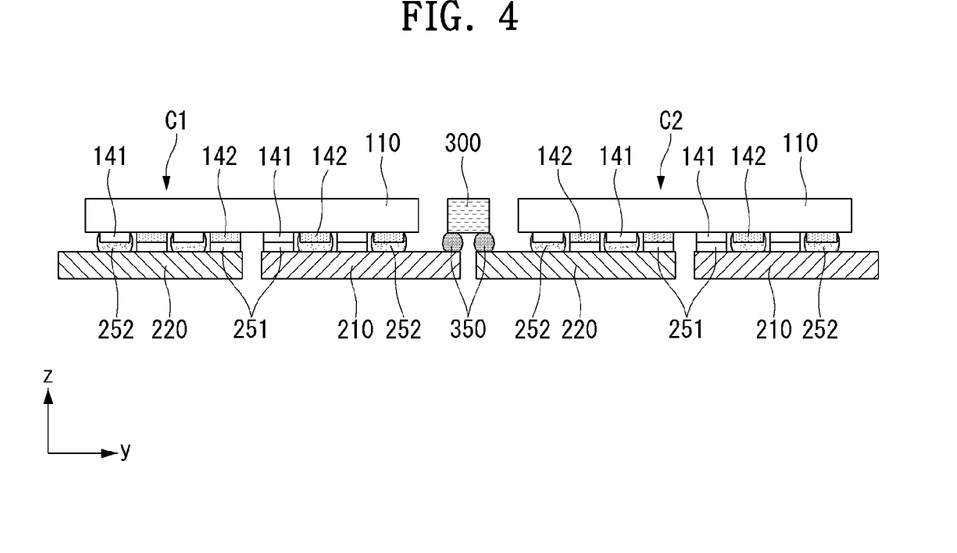
FIG. 4 is a cross-sectional view taken along line B-B' of FIG. 3.

With reference to FIGS. 3 and 4, the first and second conductive lines 200 are positioned on a back surface of a semiconductor substrate 110 included in each of the first and second solar cells C1 and C2 and are selectively connected to the first electrode 141 and the second electrode 142.

Each of the first and second solar cells C1 and C2 includes the plurality of first and second electrodes 141 and 142 that are arranged to be spaced apart from each other in the first direction y and are extended in the second direction x. The first and second electrodes 141 and 142 are alternately arranged along the first direction y.

The conductive lines 200 include the plurality of first conductive lines 210 attached to only the first electrodes 141 of each of the first and second solar cells C1 and C2 and the plurality of second conductive lines 210 attached to only the second electrodes 142 of each of the first and second solar cells C1 and C2.

In each of the first and second solar cells C1 and C2, the first conductive line 210 is attached to the first electrodes 141 at a plurality of intersections of the first conductive line 210 and the first electrodes 141 using a first conductive adhesive 251 and is insulated from the second electrodes 142 at a plurality of intersections of the first conductive line 210 and the second electrodes 142 using an insulating layer 252.

On the contrary, in each of the first and second solar cells C1 and C2, the second conductive line 220 is attached to the second electrodes 142 at a plurality of intersections of the second conductive line 220 and the second electrodes 142 using a first conductive adhesive 251 and is insulated from the first electrodes 141 at a plurality of intersections of the second conductive line 220 and the first electrodes 141 using an insulating layer 252.

Each of the first and second conductive lines 200 may be formed of a conductive metal material. Each of the first and second conductive lines 200 may include a conductive core including one of gold (Au), silver (Ag), copper (Cu) and aluminum (Al) and a coating layer formed of tin (Sn) or tin alloy solder coated on a surface of the conductive core. For example, the conductive core may be formed of copper (Cu), and the coating layer may be formed of Sn-containing alloy, for example, SnBiAg.

A linewidth of each conductive line 200 may be 0.5 mm to 2.5 mm in consideration of a line resistance of the conductive line 200 and the manufacturing cost. A distance between the first and second conductive lines 210 and 220 may be 4 mm to 6.5 mm in consideration of collection efficiency of carriers and a short circuit current.

The number of each of the first and second conductive lines 210 and 220 connected to one solar cell may be 10 to 20. Thus, a sum of the number of conductive lines 200 connected to one solar cell may be 20 to 40.

For example, the first conductive adhesive 251 may be one of a solder paste, an epoxy solder paste, and a conductive paste each including a solder. However, embodiments are not limited thereto.

The insulating layer 252 may generally use various materials including an insulating material. For example, the insulating layer 252 may use one insulating material of an epoxy-based resin, polyimide, polyethylene, an acrylic-based resin, and a silicon-based resin.

One end of the first conductive line 210 on the first solar cell C1 protrudes outside a right side of the semiconductor substrate 110 of the first solar cell C1 and overlaps the intercell connector 300 between the first and second solar cells C1 and C2. Further, one end of the second conductive line 220 on the second solar cell C2 protrudes outside a left side of the semiconductor substrate 110 of the second solar cell C2 and overlaps the intercell connector 300 between the first and second solar cells C1 and C2. In this state, the first and second conductive lines 210 and 220 are attached to the intercell connector 300, and the first and second solar cells C1 and C2 are connected in series. For example, one end of each of the first and second conductive lines 210 and 220 is attached to the intercell connector 300 by a second conductive adhesive 350. The second conductive adhesive 350 may use the same material as the first conductive adhesive 251. However, embodiments are not limited thereto.

The embodiment of the invention describes that the solar cell panel is configured such that the intercell connector 300 is positioned between the first and second solar cells C1 and C2 and electrically connects the first solar cell C1 to the second solar cell C2. However, embodiments are not limited thereto. In another embodiment, the first solar cell C1 and the second solar cell C2 may be directly connected to each other by conductive lines 200. In another embodiment, the conductive lines 200 may be positioned on the first solar cell C1, between the first solar cell C1 and the second solar cell C2, and on the second solar cell C2. The first electrode 141 of the first solar cell C1 may be connected to the conductive lines 200 by the first conductive adhesive 251, and the second electrode 142 of the first solar cell C1 may be insulated from the conductive lines 200 by the insulating layer 252. On the contrary, the first electrode 141 of the second solar cell C2 may be insulated from the conductive lines 200 by the insulating layer 252, and the second electrode 142 of the second solar cell C2 may be connected to the conductive lines 200 by the first conductive adhesive 251. As a result, the first solar cell C1 and the second solar cell C2 may be electrically connected in series to each other.

Figure 5:
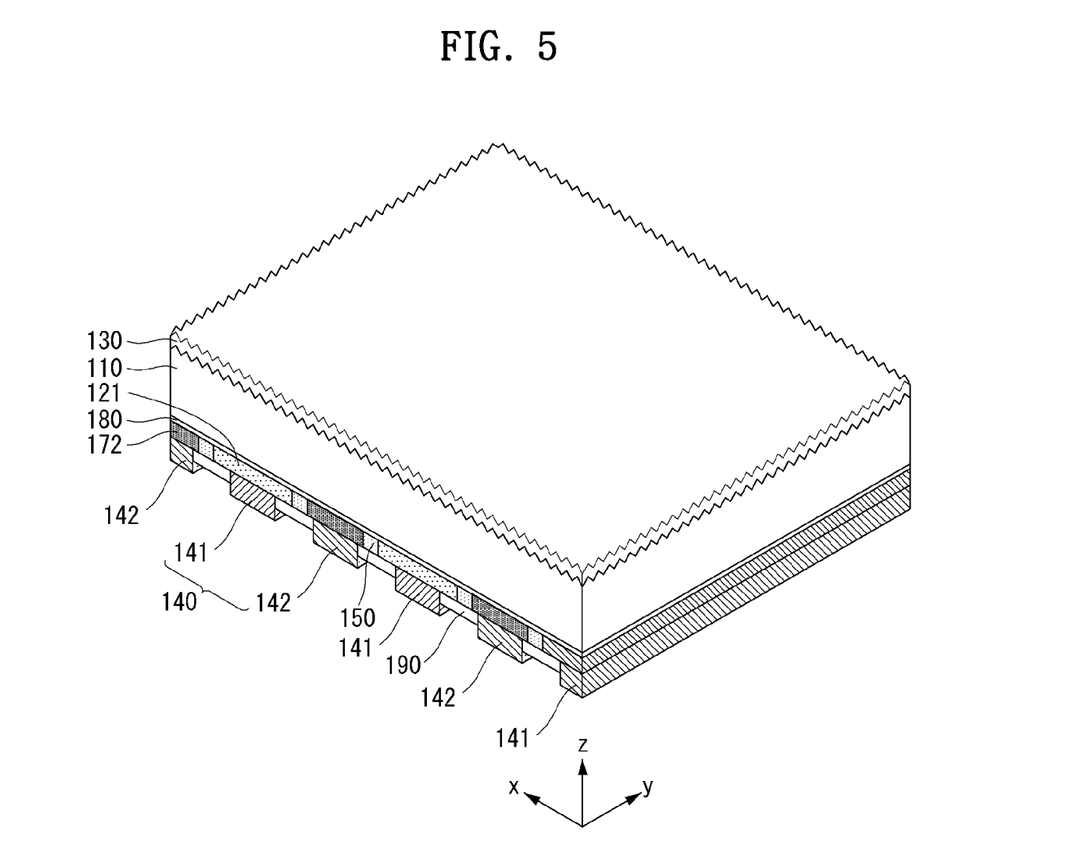
FIG. 5 is a perspective view schematically illustrating a whole shape of a back contact solar cell.

A back contact solar cell used in the above-described solar cell panel is described below with reference to FIG. 5. FIG. 5 schematically illustrates a whole shape of a back contact solar cell.

With reference to FIG. 5, a back contact solar cell includes an anti-reflection layer 130, a semiconductor substrate 110, a first back passivation layer 180, a plurality of first semiconductor regions 121, a plurality of second semiconductor regions 172, a plurality of intrinsic semiconductor regions 150, a second back passivation layer 190, a plurality of first electrodes 141, and a plurality of second electrodes 142.

In embodiments disclosed herein, the anti-reflection layer 130 and the first and second back passivation layers 180 and 190 may be omitted, if desired or necessary. However, when the back contact solar cell includes them, efficiency of the back contact solar cell may be further improved. Thus, embodiments of the invention are described using the back contact solar cell including the anti-reflection layer 130 and the first and second back passivation layers 180 and 190 as an example.

The semiconductor substrate 110 may be formed of a crystalline silicon material of one of single crystal silicon and polycrystalline silicon doped with impurities of a first conductive type or a second conductive type. For example, the semiconductor substrate 110 may be formed of a single crystal silicon wafer.

In embodiments disclosed herein, the first conductive type or the second conductive type of the semiconductor substrate 110 may be one of an n-type and a p-type. When the semiconductor substrate 110 is of the p-type, the semiconductor substrate 110 may be doped with impurities of a group III element, such as boron (B), gallium (Ga), and indium (In). Alternatively, when the semiconductor substrate 110 is of the n-type, the semiconductor substrate 110 may be doped with impurities of a group V element, such as phosphorus (P), arsenic (As), and antimony (Sb).

In the following description, embodiments of the invention are described using an example where impurities contained in the semiconductor substrate 110 are impurities of the second conductive type and are n-type impurities. However, embodiments of the invention are not limited thereto.

A front surface of the semiconductor substrate 110 may be an uneven surface having a plurality of uneven portions or having uneven characteristics. Thus, the anti-reflection layer 130 on the front surface of the semiconductor substrate 110 may have an uneven surface. Hence, an amount of light reflected from the front surface of the semiconductor substrate 110 may decrease, and an amount of light incident on the inside of the semiconductor substrate 110 may increase.

The anti-reflection layer 130 is positioned on the front surface of the semiconductor substrate 110, in order to reduce the reflection of light incident on the front surface of the semiconductor substrate 110 from the outside. The anti-reflection layer 130 may be made of at least one of aluminum oxide (AlOx), silicon nitride (SiNx), silicon oxide (SiOx), and silicon oxynitride (SiOxNy).

The first back passivation layer 180 is disposed to directly contact an entire back surface of the semiconductor substrate 110 and may be made of a thin dielectric material such as silicon carbide (SiCx) or silicon oxide (SiOx). Thus, carriers produced in the semiconductor substrate 110 can pass the first back passivation layer 180, and the first back passivation layer 180 can passivate the back surface of the semiconductor substrate 110.

In order words, the first back passivation layer 180 can pass carriers produced in the semiconductor substrate 110 and perform a passivation function with respect to the back surface of the semiconductor substrate 110.

The first semiconductor regions 121 are disposed at the back surface of the semiconductor substrate 110. For example, the first semiconductor regions 121 may be disposed to directly contact a portion of a back surface of the first back passivation layer 180.

The first semiconductor regions 121 are extended in a second direction (e.g., a y-axis direction in the drawings) at the back surface of the semiconductor substrate 110. The first semiconductor regions 121 may be made of polycrystalline silicon material of the first conductive type opposite the second conductive type.

The first semiconductor regions 121 may be doped with impurities of the first conductive type. When impurities contained in the semiconductor substrate 110 is impurities of the second conductive type, the first semiconductor regions 121 may form a p-n junction together with the semiconductor substrate 110 with the first back passivation layer 180 interposed therebetween.

Because each first semiconductor region 121 forms the p-n junction together with the semiconductor substrate 110, the first semiconductor region 121 may be of the p-type. When the first semiconductor region 121 is of the p-type, the first semiconductor region 121 may be doped with impurities of a group III element such as B, Ga, and In.

The second semiconductor regions 172 are disposed at the back surface of the semiconductor substrate 110 and are extended in the second direction y parallel to the first semiconductor regions 121. For example, each second semiconductor region 172 may directly contact a portion (spaced apart from a formation portion of each first semiconductor region 121) of the back surface of the first back passivation layer 180.

The second semiconductor regions 172 may be formed of polycrystalline silicon material more heavily doped than the semiconductor substrate 110 with impurities of the second conductive type. Thus, for example, when the semiconductor substrate 110 is doped with impurities of the second conductive type, i.e., n-type impurities, each second semiconductor region 172 may be an $n^+$-type region.

A potential barrier is formed by a difference in an impurity concentration between the semiconductor substrate 110 and the second semiconductor regions 172. Hence, the second semiconductor regions 172 can prevent or reduce holes from moving to the second semiconductor regions 172 used as a moving path of electrons through the potential barrier and can make it easier for carriers (for example, electrons) to move to the second semiconductor regions 172.

Thus, the embodiment of the invention can reduce an amount of carriers lost by a recombination and/or a disappearance of electrons and holes at and around the second semiconductor regions 172 or at and around the first and second electrodes 141 and 142 and can accelerate a movement of electrons, thereby increasing an amount of electrons moving to the second semiconductor regions 172.

The intrinsic semiconductor region 150 is formed on the back surface of the first back passivation layer 180 exposed between the first semiconductor region 121 and the second semiconductor region 172. The intrinsic semiconductor region 150 may be formed as an intrinsic polycrystalline silicon layer, that is not doped with impurities of the first conductive type or impurities of the second conductive type, unlike the first semiconductor region 121 and the second semiconductor region 172.

The second back passivation layer 190 removes a defect resulting from a dangling bond formed in a back surface of a polycrystalline silicon layer formed at the first semiconductor regions 121, the second semiconductor regions 172, and the intrinsic semiconductor regions 150, thereby preventing carriers produced in the semiconductor substrate 110 from being recombined and disappeared by the dangling bond.

The plurality of first electrodes 141 is connected to the first semiconductor regions 121 and is extended in the second direction y. The first electrodes 141 collect carriers (for example, holes) moving to the first semiconductor regions 121.

The plurality of second electrodes 142 is connected to the second semiconductor regions 172 and is extended in the second direction y in parallel with the first electrodes 141. The second electrodes 142 collect carriers (for example, electrons) moving to the second semiconductor regions 172.

The first and second electrodes 141 and 142 are extended in the second direction y and are spaced apart from each other in a first direction (e.g., an x-axis direction in the drawings). Further, the first and second electrodes 141 and 142 are alternately disposed in the first direction x.

A blocking portion 400 according to an embodiment of the invention and a disposition shape of the blocking portion 400 are described below with reference to FIGS. 6 and 7.

Figure 6:
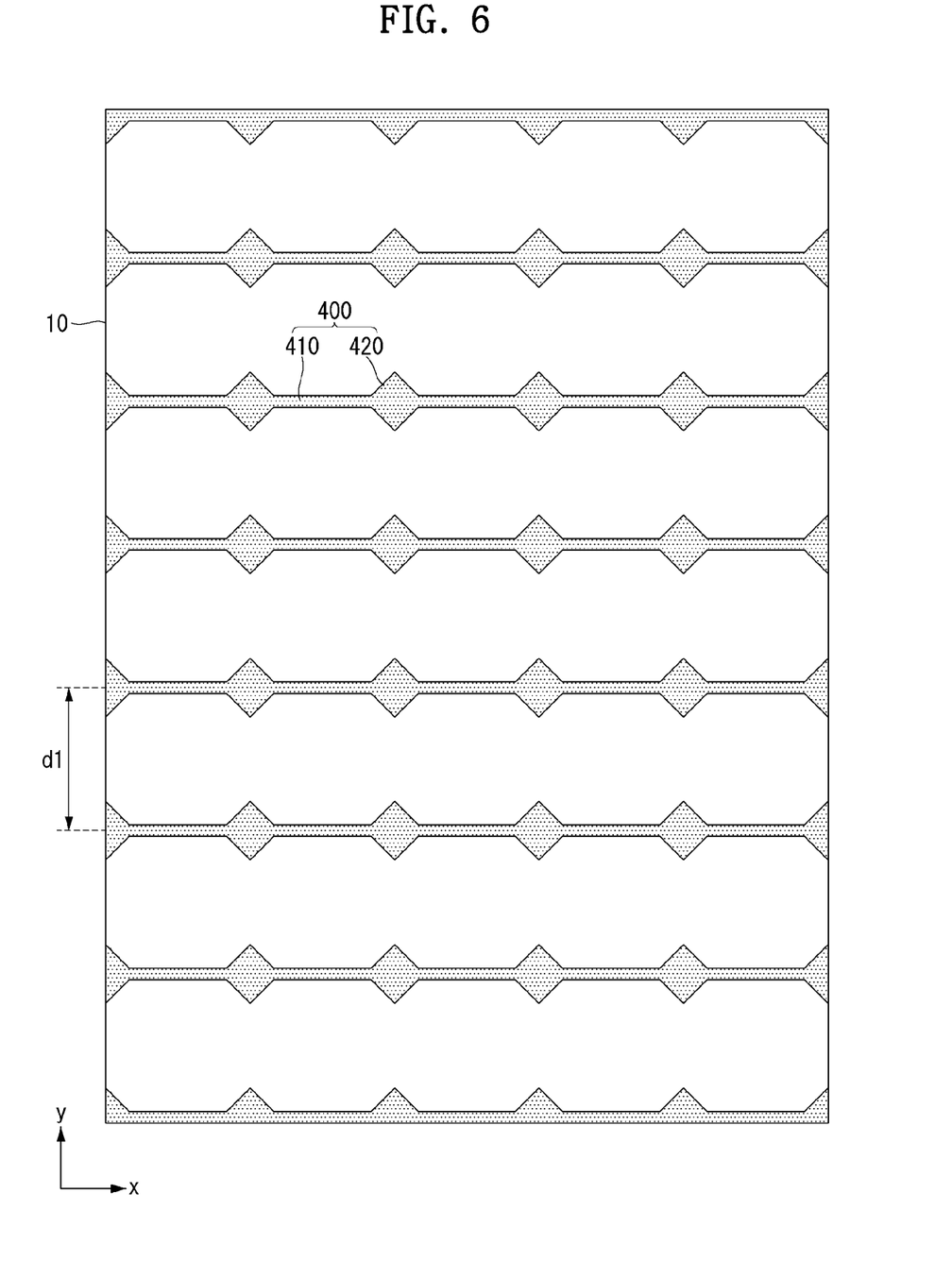
FIG. 6 is a plan view illustrating a whole shape of a front substrate.
Figure 7:
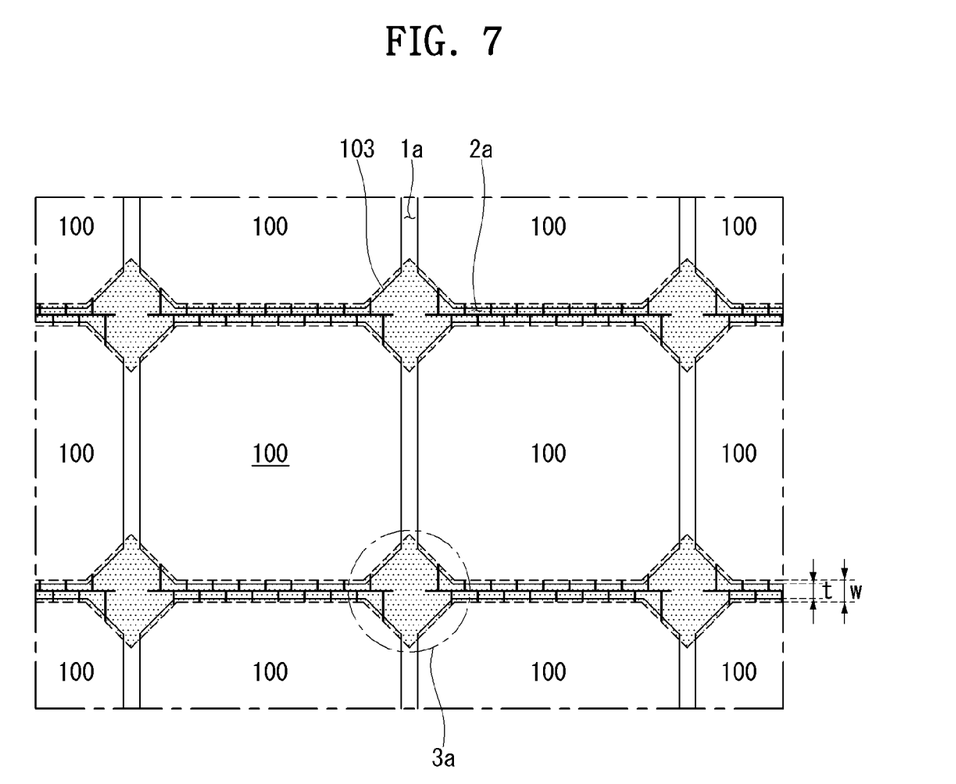
FIG. 7 is an enlarged view of a portion "C" of FIG. 1.

FIGS. 6 and 7 show a simplified representation of some of the components for convenience of explanation and illustrate a solar cell panel having a configuration including an intercell connector as an example. More specifically, FIG. 6 is a plan view illustrating a whole shape of a front substrate, and FIG. 7 is an enlarged view of a portion "C" of FIG. 1.

The blocking portion 400 is formed inside a front substrate 10 and visually blocks an intercell connector 300 seen between solar cells and first and second conductive lines 210 and 220.

The blocking portions 400 each have a long line shape in a second direction (e.g., an x-axis direction in the drawings) and are disposed in parallel with one another. In embodiments disclosed herein, the line shape refers to a straight shape extending from one end to the other end of the front substrate 10 without interruption in the second direction x.

As shown in FIGS. 6 and 7, the plurality of blocking portions 400 are spaced apart from one another by a first distance d1 in a first direction (e.g., a y-axis direction in the drawings). The first distance d1 is a distance between the two adjacent blocking portions 400 and is based on a distance between central lines passing the blocking portion 400. The first distance d1 corresponds to a width of the solar cell along the first direction y.

In the embodiment of the invention, each solar cell 100 is made using a pseudo-square shaped substrate. Because of this, a first area 1a between two strings in the first direction y and a second area 2a between two solar cells 100 in the second direction x form a lattice shape. Further, because each edge of the solar cell 100 includes an inclined chamfer 103, an intersection area 3a of the first area 1a y and the second area 2a has approximately a rhombus shape.

Each blocking portion 400 includes a first portion 410 having a predetermined width and a second portion 420 having a varying width. The first portion 410 visually covers the second area 2a between two solar cells 100 at each line, and the second portion 420 visually covers the intersection area 3a. Namely, the second area 2a and the intersection area 3a are not visually seen by the first portion 410 and the second portion 420, respectively.

It is preferable, but not required, that a width w of the first portion 410 is greater than a distance t between two solar cells that are adjacent to each other in the first direction. The blocking portion 400 is upwardly spaced apart from the intercell connector 300 by a predetermined distance. Therefore, when the width w of the first portion 410 is equal to the distance t between two solar cells, the intercell connector 300 exposed through the second area 2a and the first and second conductive lines 210 and 220 when viewed from the side may be seen.

The width w of the first portion 410 may require a margin of about 1.5 mm in upward and downward directions in consideration of a process margin for an alignment between the front substrate 10 and the solar cells 100. Thus, the maximum width w of the first portion 410 may be equal to a sum (=t+3 mm) of the distance t between two solar cells, that are adjacent to each other in the first direction, and 3 mm. Because the blocking portion 400 covers the solar cell and reduces efficiency of electricity generation of the solar cell, it is preferable, but not required, that the blocking portion 400 covers the solar cell at a minimum. Considering this, it is preferable, but not required, that the maximum width w of the first portion 410 is equal to a sum (=t+3 mm) of the distance t between two solar cells and 3 mm.

It is preferable, but not required, that the second portion 420 has a rhombus shape corresponding to the intersection area 3a. It is preferable, but not required, that an inclined angle θ1 of the second portion 420 is equal to an inclined angle θ2 of the chamfer 103 within an error range. This is to match the shape of the blocking portion 400 with the shape of the intersection area 3a. Hence, the embodiment of the invention can improve the design of the solar cell panel and facilitate the alignment between the front substrate 10 and the solar cells 100 when the front substrate 10 is laid up on the solar cells 100.

As shown in FIGS. 6 and 7, the solar cells 100 disposed in the intersection area 3a form approximately a rhombus shape by the chamfers 103, and the second portion 420 has a rhombus shape larger than the rhombus shape formed by the solar cells 100 and thus may serve as an alignment key. Hence, when the front substrate 10 is laid up on the solar cells 100, the second portion 420 is disposed in conformity with the chamfers 103 of the solar cells 100 disposed in the intersection area 3a. As a result, the blocking portion 400 can be properly positioned.

Figure 8:
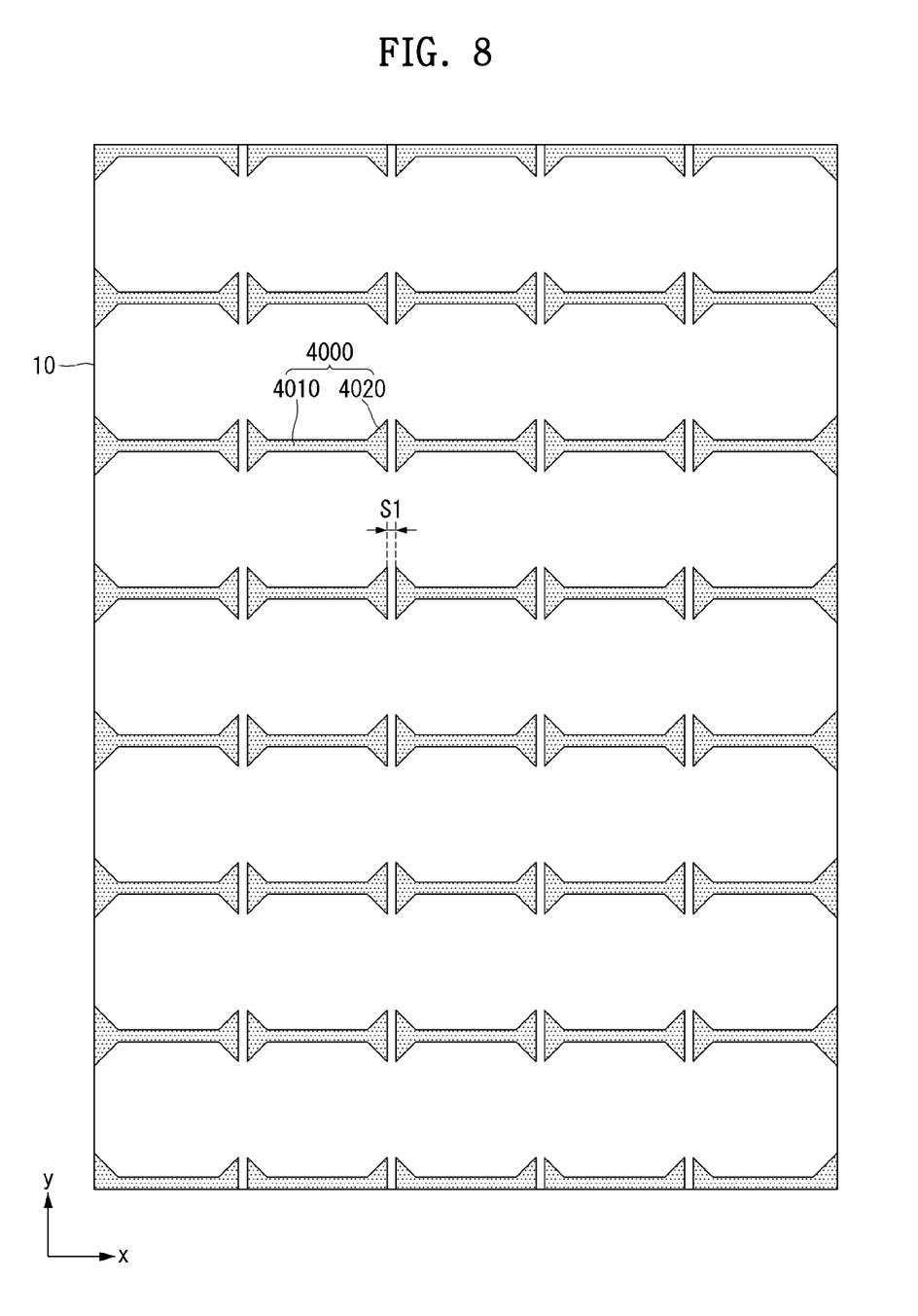
FIG. 8 is a plan view of a blocking portion, that is separately formed, as a modified example of an embodiment of the invention.

FIG. 8 illustrates that a blocking portion is partially formed to cover between two solar cells that are adjacent to each other in the first direction, as a modified example of an embodiment of the invention. In the modified example, a blocking portion 4000 includes a first portion 4010 and a second portion 4020. Since the first portion 4010 is substantially the same as the first portion 410 of the blocking portion 400 shown in FIG. 6, a further description may be briefly made or may be entirely omitted. The second portions 4020 are respectively formed at both ends of the first portion 4010 and have a gradually increasing width. Hence, the second portions 4020 are configured to cover a space exposed by chamfers of the solar cells in the first direction. The blocking portion 4000 according to the modified example has a dumbbell shape.

In the modified example, the blocking portion 4000 is positioned between every two solar cells, that are adjacent to each other in the first direction, and covers a portion of an intercell connector 300 seen between the two solar cells and a portion of conductive lines. Hence, the neighboring blocking portions 4000 in the second direction are spaced apart from each other by a predetermined distance s1. It is preferable, but not required, that the predetermined distance s1 is less than a distance (or a distance between strings) between solar cells that are adjacent to each other in the second direction. The blocking portion 4000 is upwardly spaced apart from the intercell connector 300 by a predetermined distance. Therefore, when the predetermined distance s1 is equal to or greater than the distance between the solar cells that are adjacent to each other in the second direction, the intercell connector 300 and first and second conductive lines 210 and 220 when viewed from the side may be seen or exposed.

Figure 9:
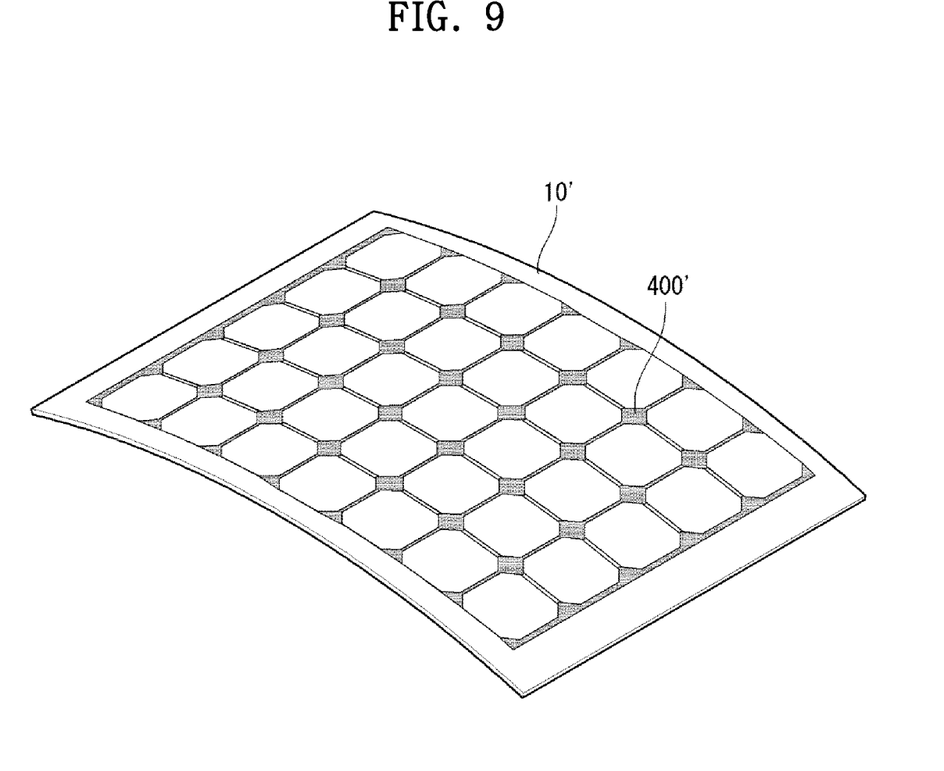
FIG. 9 is a plan view illustrating a whole shape of a curved solar cell panel according to another embodiment of the invention.
Figure 10:
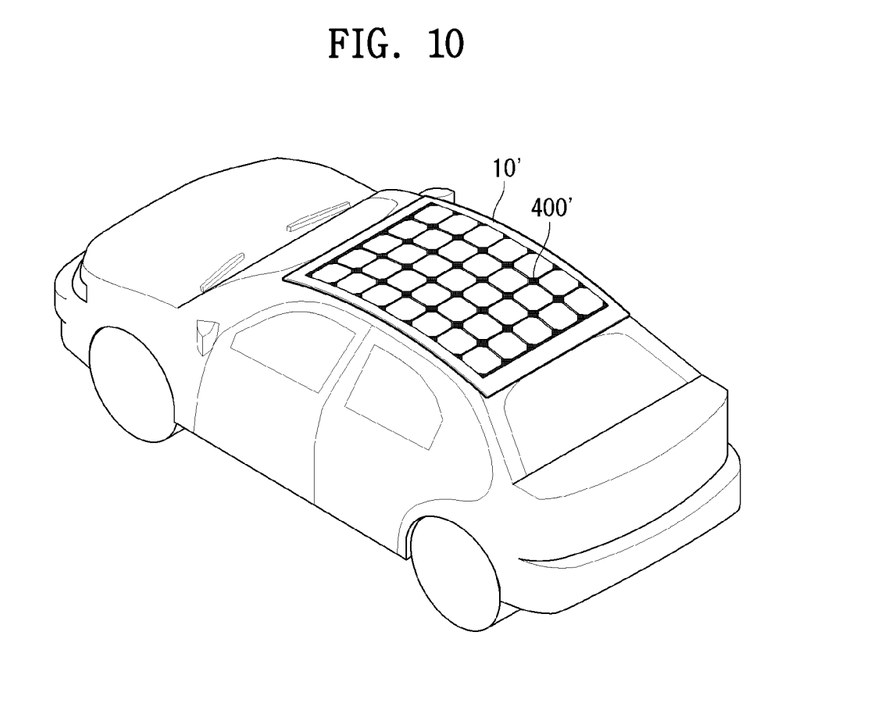
FIG. 10 illustrates an example where a solar cell panel according to another embodiment of the invention is mounted on a roof of a vehicle.

FIG. 9 illustrates a whole shape of a curved solar cell panel according to another embodiment of the invention. FIG. 10 illustrates an example where a curved solar cell panel is mounted on a roof of a vehicle.

The above-described solar cell panel illustrated in FIGS. 1 to 8 has a flat shape so that it can be generally used in electricity generation of solar cells. On the other hand, the curved solar cell panel illustrated in FIGS. 9 and 10 has a curved shape so that it can be used in bent locations. The configuration of the curved solar cell panel is substantially the same as the configuration of the above-described flat solar cell panel, except that a front substrate 10' of the curved solar cell panel is bent to have a curved surface. Thus, since configurations of a back sheet, solar cells connected to one another by intercell connectors and conductive lines, and encapsulants are substantially the same as the above-described flat solar cell panel, a further description may be briefly made or may be entirely omitted.

A back surface of the front substrate 10' having the curved surface includes a blocking portion 400'.

Because the solar cells are connected by the intercell connector and the flexible conductive lines, the solar cells may be attached to the curved front substrate in a bent shape corresponding to the curved front substrate even when the front substrate has the curved surface. The radius of curvature and the shape of a curved surface of the curved solar cell panel may be variously changed depending on a shape of a roof of a vehicle mounted with the curved solar cell panel.

As shown in FIGS. 9 and 10, the curved solar cell panel is mounted on the roof of the vehicle and is used to power the vehicle. Typically, the curved solar cell panel is mainly used in a hybrid vehicle using electricity and gasoline. When the curved solar cell panel is mounted on the roof of the vehicle, brackets may be used to fix the curved solar cell panel to the vehicle.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell panel comprising:
   a plurality of back contact solar cells arranged in a first direction and a second direction perpendicular to the first direction, wherein the plurality of back contact solar cells include a first solar cell and a second solar cell, and wherein each of the plurality of back contact solar cells includes a plurality of first electrodes and a plurality of second electrodes on a back surface of each of the plurality of back solar cells;
   a front transparent substrate disposed on a front side of the plurality of back contact solar cells;
   a back sheet disposed on a back side of the plurality of back contact solar cells;
   an encapsulant covering the plurality of back contact solar cells between the front transparent substrate and the back sheet;
   an intercell connector electrically connecting the plurality of first electrodes of the first solar cell and the plurality of second electrodes of the second solar cell, and disposed between the first solar cell and the second solar cell; and
   a blocking portion formed to have substantially the same color of the back sheet, and visually blocking from view the intercell connector, and made of an opaque ceramic resin,
   wherein the blocking portion is directly disposed on a back surface of the front transparent substrate and is a printed pattern on the back surface of the front transparent substrate,
   wherein the encapsulant is disposed between the blocking portion and the plurality of back contact solar cells, and the encapsulant is further disposed between the blocking portion and the intercell connector, and
   wherein the blocking portion entirely covers spacings between the plurality of back contact solar cells positioned on the same line in the first direction, and is spaced apart from the intercell connector.

2. The solar cell panel of claim 1, wherein a distance between the blocking portion and the back sheet is less than a distance between the front transparent substrate and the back sheet.

3. The solar cell panel of claim 1, wherein the blocking portion includes a first portion disposed between neighboring two back contact solar cells of the plurality of back contact solar cells in the first direction, and a second portion having a rhombus shape located in an intersection area where four back contact solar cells of the plurality of back contact solar cells are arranged, and
wherein a width of the first portion is less than a sum of a distance between the neighboring two back contact solar cells plus 3 mm.

4. The solar cell panel of claim 1, wherein each of the plurality of back contact solar cells is formed using a pseudo-square shaped semiconductor substrate, of which an edge has an inclined chamfer.

5. The solar cell panel of claim 1, wherein a plurality of blocking portions are positioned between every two back contact solar cells which are adjacent to each other in the first direction.

6. The solar cell panel of claim 1, wherein a width of the blocking portion is greater than a width of the intercell connector.

7. A curved solar cell panel for a roof of a vehicle, the curved solar cell panel comprising:
a plurality of back contact solar cells arranged in a first direction and a second direction perpendicular to the first direction, wherein the plurality of back contact solar cells include a first solar cell and a second solar cell, and wherein each of the plurality of back contact solar cells includes a plurality of first electrodes and a plurality of second electrodes on a back surface of each of the plurality of back solar cells;
a front transparent substrate disposed on a front side of the plurality of back contact solar cells and having a curvature;
a back sheet disposed on a back side of the plurality of back contact solar cells;
an encapsulant covering the plurality of back contact solar cells between the front transparent substrate and the back sheet;
an intercell connector electrically connecting the plurality of first electrodes of the first solar cell and the plurality of second electrodes of the second solar cell, and disposed between the first solar cell and the second solar cell; and
a blocking portion formed to have substantially the same color of the back sheet, and visually blocking the intercell connector, and made of an opaque ceramic resin,
wherein the blocking portion is directly disposed on a back surface of the front transparent substrate and is a printed pattern on the back surface of the front transparent substrate,
wherein the encapsulant is disposed between the blocking portion and the plurality of back contact solar cells, and the encapsulant is disposed between the blocking portion and the intercell connector, and
wherein the blocking portion entirely covers spacings between the plurality of back contact solar cells positioned on the same line in the first direction, and is spaced apart from the intercell connector.

8. The solar cell panel of claim 1, wherein the blocking portion extends only in the first direction to overlap and correspond to the intercell connector,
wherein the intercell connector is interposed between the plurality of back contact solar cells, and is coplanar with the plurality of back contact solar cells, and
wherein the intercell connector is sandwiched between the blocking portion and the plurality of first electrodes and the plurality of second electrodes at the spacings of the plurality of back contact solar cells.

9. The solar cell panel of claim 1, further comprising a first area that is disposed between adjacent solar cells in the second direction, and a second area that is disposed between adjacent solar cells in the first direction,
wherein the blocking portion is formed in the second area, and not formed in the first area.

10. The curved solar cell panel of claim 7, further comprising a first area that is disposed between adjacent solar cells in the second direction, and a second area that is disposed between adjacent solar cells in the first direction,
wherein the blocking portion is formed in the second area, and not formed in the first area.

11. The curved solar cell panel of claim 7, wherein the front transparent substrate includes a first area that overlaps a first region between adjacent back contact solar cells in the first direction, and a second area that overlaps a second region between adjacent solar cells in the second direction, and
wherein a color of the blocking portion viewed through the first area and a color of the back sheet viewed through the second area are substantially the same color.

12. The curved solar cell panel of claim 1, wherein the front transparent substrate includes a first area that overlaps a first region between adjacent back contact solar cells in the first direction, and a second area that overlaps a second region between adjacent solar cells in the second direction, and
wherein a color of the blocking portion viewed through the first area and a color of the back sheet viewed through the second area are substantially the same color.

* * * * *